United States Patent
Adams et al.

(10) Patent No.: US 6,850,074 B2
(45) Date of Patent: Feb. 1, 2005

(54) SYSTEM AND METHOD FOR ISLAND DETECTION

(75) Inventors: Larry L. Adams, Windsor, CO (US); Jeffrey G. Pope, Fort Collins, CO (US)

(73) Assignee: Encorp, Inc., Windsor, CO (US)

( * ) Notice: Subject to any disclaimer, the term of this patent is extended or adjusted under 35 U.S.C. 154(b) by 148 days.

(21) Appl. No.: 10/211,281

(22) Filed: Aug. 5, 2002

(65) Prior Publication Data

US 2004/0021470 A1 Feb. 5, 2004

(51) Int. Cl.$^7$ .................. G01R 31/08; G01R 19/14; G01R 21/06; H02J 3/00
(52) U.S. Cl. .............. 324/527; 324/133; 702/60
(58) Field of Search ................ 324/133–134, 324/527–528, 76.74, 508, 512; 702/60; 307/43, 31, 11

(56) References Cited

U.S. PATENT DOCUMENTS

| | | | |
|---|---|---|---|
| 5,686,766 A | | 11/1997 | Tamechika |
| 6,172,889 B1 | * | 1/2001 | Eguchi et al. ............... 363/95 |
| 6,188,145 B1 | * | 2/2001 | Stewart ...................... 307/125 |
| 6,219,623 B1 | | 4/2001 | Wills |
| 6,429,546 B1 | * | 8/2002 | Ropp et al. .................. 307/31 |
| 6,603,290 B2 | * | 8/2003 | Hochgraf ..................... 322/37 |

OTHER PUBLICATIONS

"Development of a Logical Rule–based Islanding Detection Method for Distributed Resources" Jang et al. IEEE No. 0–7803–7322–7/02. Jul. 02, pp. 800–806.*

"IEEE Recommended Practice for Protection and Coordination of Industrial and Commercial Power Systems", IEEE Std. 242–2001 rev. of IEEE Std. 242–1986, abstract and table of contents, 10 pgs.
Umist Ventures Limited, Generator Transfer Profile, 3 pgs. downloaded from Umist AC UK web page on Apr. 26, 2002.
"Protective Relaying Theory and Applications", ed. by Walter A. Elmore, ABB Power T&D Co. Inc., 1994, table of contents and pp. 345–355.
"Automatic Generator Loading Control (AGLC)", Woodward, product specification 82399A, 1988, 4 pgs.
EEE P1547/D08, Draft Standard for Interconnecting Distributed Resources with Electric Power Systems, IEEE, 2001, 41 pgs.

* cited by examiner

*Primary Examiner*—N. Le
*Assistant Examiner*—Jeff W Natalini
(74) *Attorney, Agent, or Firm*—Morrison & Foerster LLP

(57) ABSTRACT

A system and method is provided for detecting an island condition using active detection. The active detection involves biasing the voltage, frequency, current or phase of a distributed resource connected to a utility network. Biasing the distributed resource involves inducing a change of voltage, frequency, current or phases above or below the normal operating values. The impact of this biasing on the system operating parameters can then be measure to determine if an island condition exists. Once an island condition has been detected, the system can initiate an anti-islanding procedure to remove the distributed resource from the utility network such as opening a breaker connecting the distributed resource to the network. Additionally, the system and method can include a passive element for detecting frequency and voltage (or other parameters) shifts above certain points.

15 Claims, 16 Drawing Sheets

| NAME | INPUT | OUTPUT | SETPOINT RANGE | NOTE |
|---|---|---|---|---|
| CB AUX | X (REAL) | | | |
| VOLTAGE BIAS IN | X (REAL) | X (REAL) | | |
| SPEED BIAS IN | X (REAL) | X (REAL) | | |
| THREE PHASE Hz IN | X (REAL) | | | |
| LOAD CONT. MODE | X (INT) | | | FOR DETECTING LOAD MODE |
| BLOCKING INPUT | X (BOOLEAN) | | | |
| ACTIVE DETECTION | X (BOOLEAN) | | | USE ONLY IN SYSTEMS WITH STIFFNESS RATIO > 20. |
| SYSTEM MASTER | X (BOOLEAN) | | | |
| TARGET RESET | X (BOOLEAN) | | | |
| df/dt SHORT | | | .1 TO 5 Hz/3 CYCLES IN .01 INCREMENTS | |
| df/dt LONG | | | .01 TO 1 Hz/SECOND IN .01 INCREMENTS | |
| BIAS OFFSET LEVEL | | | 0 TO 10% IN .1% INCREMENTS | |
| TARGET | | X (BOOLEAN) | | |
| TARGET INHIBITED | | X (BOOLEAN) | | |

FIG. 6

SYSTEM AND METHOD FOR ISLAND DETECTION

FIELD OF THE INVENTION

The present invention relates to a system and method for island detection in an electrical power system. More particularly, the present invention relates to island detection in an electrical power system using active and passive detection.

BACKGROUND OF THE INVENTION

Utility networks provide an electrical power system to utility customers. In modern utility networks, the network comprises the utility power source, consumer loads, and distributed resources (DR). Distributed resources are resources that can also supply electrical power to the network. The number and types of distributed resources is growing rapidly and can include photovoltaics, wind, hydro, fuel cells, storage systems such as battery, super-conducting flywheel, and capacitor types, and mechanical means including conventional and variable speed diesel engines, Stirling engines, gas turbines, and micro-turbines. These DRs are connected to the utility network such that they operate in parallel with the utility power sources.

One common problem faced by modern utility networks is the occurrence of islanding. Islanding is the condition where a DR is severed from the utility network, but continues to supply power to portions of the utility network after the utility power supply is disconnected from those portions of the network. The island condition complicates the orderly reconnection of the utility network and poses a hazard to utility personnel as well as equipment. Thus, it is important for an island condition to be detected and subsequently eliminated.

Several techniques have been proposed to guard against islanding. For example, one method involves the monitoring of auxiliary contacts on all circuit breakers of the utility system between its main source of generation and DRs. The auxiliary contacts are monitored for a change of state which represents an open circuit breaker on the utility source. The utility circuit breaker is typically monitored and tripped by external protective relays. When a loss of utility is detected by the change in state of the auxiliary contact of a circuit breaker, a transferred trip scheme is employed to open the interconnection between the utility and the DR. A transferred trip scheme uses the auxiliary contacts of the utility source being monitored. The auxiliary contacts are connected in parallel with other devices which can trigger the trip of the local interconnection breaker. When the auxiliary contacts change state, a trip is induced on the local interconnection breaker. This prevents an island condition from occurring. The drawback of such a method is that often the point of utility isolation (the point at which the utility circuit breaker opens) is of such a distance from the local DR that running a contact status signal back to the local DR control system is not practical.

Another method of detecting an island condition is to use known over/under frequency (e.g. 81 o,u) and known under and over voltage (e.g. 27,59) protective relays at, or below (within the local distribution system) the point of interconnection to determine when an island condition exists. The use of these protective relays relies upon the probability that the load being produced by the local DR is not exactly matched to the load produced by the island event. During normal operation (no island event present), a local DR supports a load on the network by supplying power at a normal voltage and frequency (usually the system voltage and frequency). When an island event occurs, the local DR becomes the only power source for a portion of the network. If the load on that portion of the islanded network is different from the load supplied by the local DR before the island event, the voltage and frequency at which the local DR supplies power will be affected.

FIGS. 7–12 illustrate this for a conventional system with two generators (labeled 1 and 2 on the graphs) paralleled to a utility power source (labeled 3 on the graphs) and a resistive load. Each generator is a distributed resource (H1 and H2). FIG. 7 shows the voltage and frequency response under normal operating conditions. FIG. 8 shows the response when the load at islanding is greater than the power supplied by the generators prior to islanding at T=1 second. Note the drop in frequency on both generators while the utility frequency remains constant. FIG. 9 shows the response when the load at islanding is less than the power supplied by the generators prior to islanding at T=1 second. Note the rise in frequency on both generators while the utility frequency remains constant. FIG. 10 shows the response when the load at islanding is equal to the power supplied by the generators prior to islanding at T=1 second. Note the constant frequency on both generators and the utility. This condition would not be detected by under/over frequency protective relays. FIG. 11 shows the response when the load at islanding is larger than the rated generator capacity prior to islanding at T=1 second. Note the degradation in generator frequency from 60 Hz (376.8 r/sec) to approximately 59 Hz (300 r/sec) in less than 2 seconds. This disruption would likely be picked up by under/over voltage and frequency protective relays (passive detection). FIG. 12 shows the response when the load at islanding is slightly larger than the maximum generator capacity prior to islanding at T=1 second. Note the long decay period of the generator frequency. The frequency changes from 60 Hz to 59.4 Hz in over 5 seconds. This situation would lead to long trip times using only passive island detection.

If, for instance, the KW (real) load is less than that of the islanded system at the time of islanding, an increase in local frequency will occur (see FIG. 9). The amplitude of this frequency change is determined by the difference in the load on the DR at the time of islanding, and the load on the islanded system. The period of the frequency change is dependent upon the response of the DR. If the DR is a generator, for example, the period of the frequency change is dependent upon the response of the generator speed governor and the acceleration characteristic of the generator, which control the rate of change in the speed of the generator.

Conversely, if the load on the islanded system is greater than that on the DR at the instant islanding occurs, then the frequency of the DR will drop in response to the increased load (see FIG. 8). Similarly, DR voltage will increase or decrease depending on the VAR (reactive) loads imposed upon the generator at the time of islanding.

As can be seen from the figures, the techniques described above do not detect all island conditions. If the DR is supplying exactly the same real and reactive load as is being consumed by the loads on the utility network, the resulting island condition is not detectable by conventional techniques. There will be no discernable shift in the frequency or voltage of the islanded system as the DR is perfectly supplying the islanded loads. When a system is operating at or near this balance, there is a non-detection area where traditional over/under frequency and over/under voltage relays either fail to detect, or are slow to detect the islanded condition (see FIG. 10).

These and other drawbacks and disadvantages exist in conventional systems and methods.

SUMMARY OF THE INVENTION

The present invention provides a system and method for island detection in an electrical power system.

In accordance with one embodiment of the invention, a method of island detection is provided. The method of island detection includes energizing a distributed resource to supply power to a network; operating the distributed resource at normal system parameters; inducing a change in at least one operating parameter of the distributed resource; and monitoring one of the system parameters.

In accordance with one embodiment of the invention, a system for detecting an island condition in a utility network is provided. The system includes a distributed resource connected to the utility network, an active detection module monitoring the distributed resource, and a biasing device connected to the distributed resource.

Still other embodiments of the present invention will become apparent to those skilled in the art from the following detailed description, wherein is shown and described only the embodiments of the invention by way of illustration of the best modes contemplated for carrying out the invention. As will be realized, the invention is capable of modification in various aspects, all without departing from the spirit and scope of the present invention. Accordingly, the drawings and details description ought to be regarded as illustrative in nature and not restrictive.

BRIEF DESCRIPTION OF THE DRAWINGS

FIG. 6 depicts one example of I/O and setpoints for the Island Detection Module.

DETAILED DESCRIPTION OF PREFERRED EMBODIMENTS OF THE INVENTION

Figure 1:
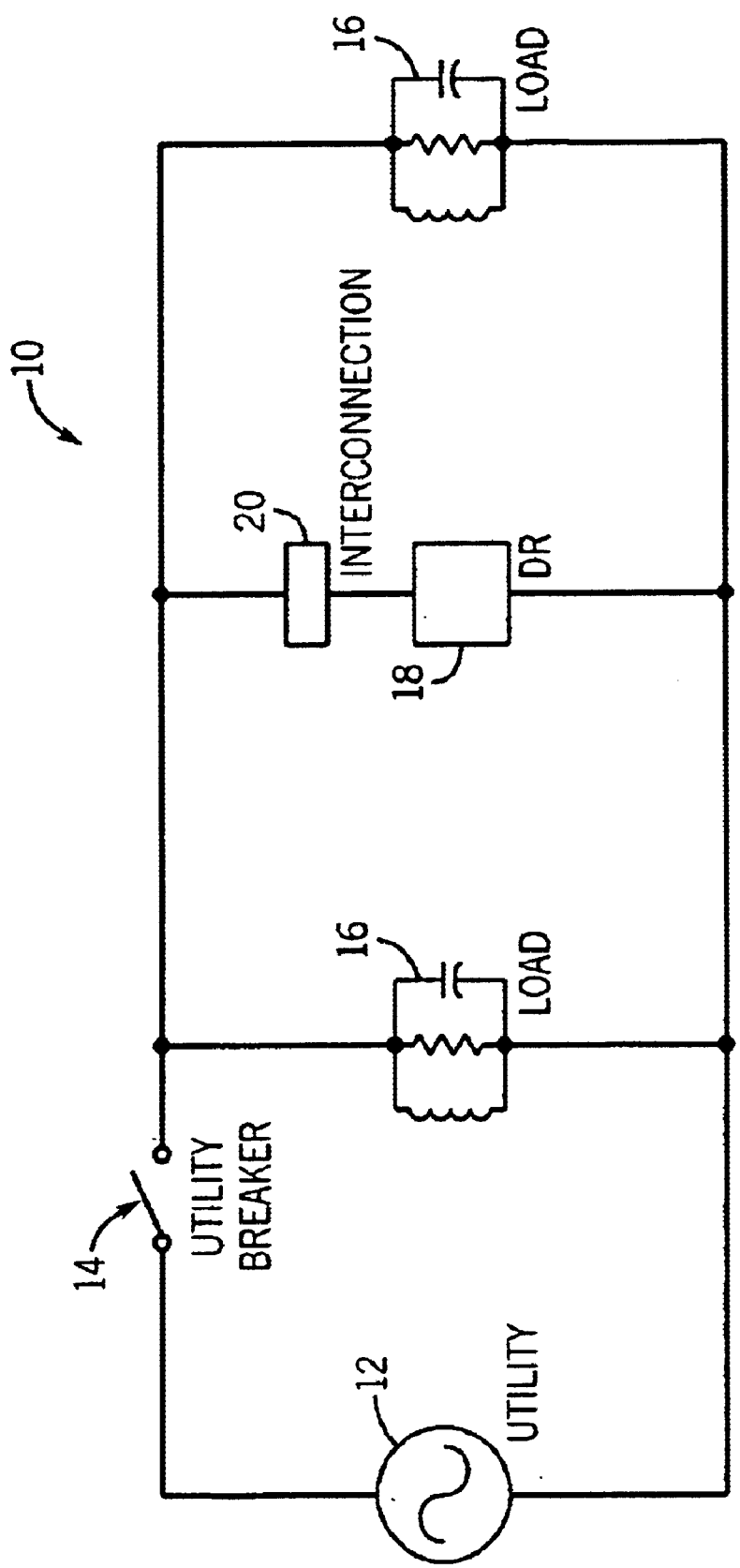
FIG. 1 depicts an example of a utility network with a distributed resource.

Although the invention has been described relative to particular embodiments, one of skill in the art will appreciate that this description is merely exemplary and the system and method of this invention may include additional or different components, while operating within the scope of the invention.

The present invention encompasses a system and method for detecting an island condition in a utility network in a rapid and accurate manner. Island detection in a network with distributed resources relies upon a shift in the operating parameters of the network to detect islanding conditions. When a distributed resource is energized and connected to the network, the distributed resource will provide power to the network at the normal system operating parameters. By design, the distributed resource is set to supply power at the same parameters as the utility source (for example at a typical utility frequency of 60 Hz). These parameters include the system voltage and frequency. The normal system operating parameters are controlled by the utility source as the dominate power source on the network. As the distributed resources are connected to the network, they will synchronize with the system parameters to provide power at the system parameters. While the utility source is energizing the network, shifts or fluctuations in the operating parameters of the distributed resources will not significantly affect the system operating parameters. This is because the utility source is the dominant power source in the network and the network operating parameters are a function of the individual parameters of all sources supplying power to the network.

Large shifts in distributed resource loading are typically imposed by transiting conditions experienced when a distributed resource, supplying a controlled load against a constant frequency and voltage source (the utility), is separated from the source and no longer has a fixed reference for voltage and frequency (see FIGS. 7–12). For example, the utility is supplying power for a 100 MW load and the distributed resource is supplying power for a 100 KW load. If the utility source drops out of the network, the 100 MW load (or a portion of the load depending on where the disconnection occurs) it was supplying will now be supplied by the distributed resource. The sudden increase from 100 KW to 100.1 MW load on the distributed resource will cause the operating parameters of the distributed resource (now the system operating parameters) to fluctuate. The fluctuation is caused by the distributed resource's strain to supply the power being drawn by the increased load. The resulting transit conditions are normally detected using conventional over/under frequency (e.g. 81 o/u device), and/or over/under voltage (e.g. 27/59 device) protective relays (See *IEEE Buff Book—Protection and Coordination* and *Protective Relaying Theory and Applications—ABB Power T & D Company, Inc.* pp 348–355). This is passive detection. Passive detection relies on detection of changes in the operating parameters of the system without influencing the operating parameters.

Figure 10:
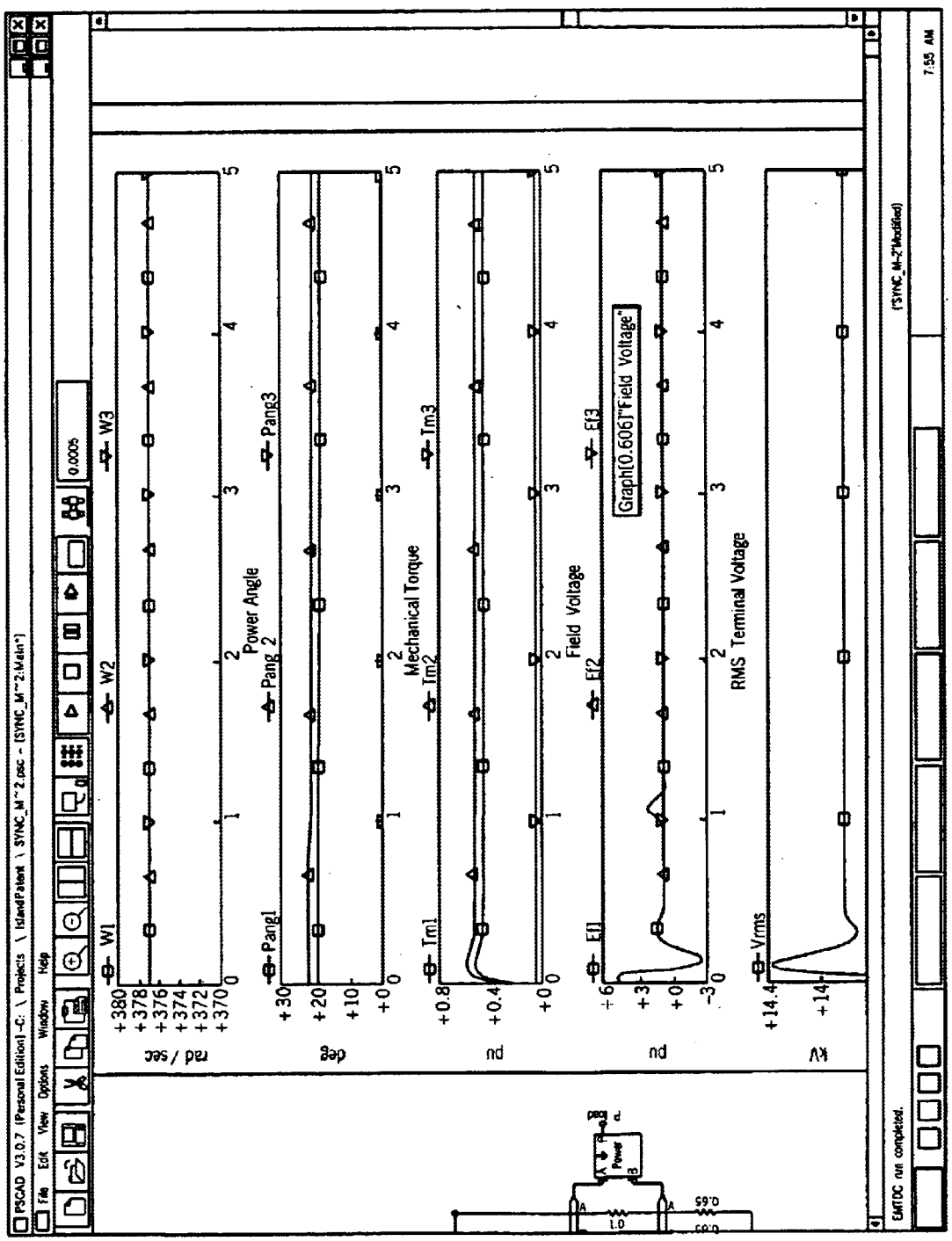
FIG. 10 depicts the system response when the system is islanded with the local loads equal to the generator loads at the time of islanding.

Passive detection does not always detect island conditions as shown in FIG. 10. FIG. 10 depicts a system in which the real load of the system is equal to the real load being produced by generators H1 and H2. At the time of separation from the utility, there is no discernable change in the system frequency. This island event would not be detected by passive means. Over/under frequency protective relays would not trip because the system frequency is operating within normal limits. However, active detection is able to detect such island events.

Active detection, which also relies on detection of changes in the operating parameters of the system, influences the operating parameters and monitors the resulting impact on the system. Active island detection induces a change in the operating parameters (frequency, voltage, current or phase) of the distributed resource and monitors the impact the change has on the system operating parameters. When the distributed resource is connected to a network also supplied by a utility source, the impact of the induced change is negligible because the resource is only contributing a small portion of the power to the network. When the utility source is disconnected or removed from the network, the induced change creates a larger impact on the system operating parameters because the distributed resource is contributing all the power to the network. Thus, active detection is able to detect island events such as those shown in FIG. 10.

This can be illustrated using the example above. The examples herein focus on shifts or changes in the frequency, but it should be understood that any of the system parameters (frequency, voltage, current or phase) can be used by the invention. In this example, there is a utility source supplying 100 MW of power at 60 Hz. A distributed resource is energized and connected to the network. The distributed resource supplies 100 KW of power and is initially synchronized with the utility to supply power at 60 Hz. The frequency of the network is monitored for changes that might indicate an island event such as a frequency shift of more than 1% (a network frequency shift to below 59.4 or above 60.6 Hz). For active detection, a change is induced in the frequency of the power supplied by the distributed resource. In this example, a 10% change (reduction) of frequency is induced in the distributed resource KW control after the KW control PID. The resulting offset in frequency is compensated for by the integrator in the load control PID feedback loop. As a result, there is no discernable shift in KW load as long as there is a solid frequency reference (the utility) present. If an island event occurs and the utility source is removed from the network, the 10% shift in the frequency of the distributed resource will translate to a network frequency of 54 Hz. This is because the only power being supplied to the network is by the distributed resource that is now supplying power at 54 Hz. When island monitoring detects the frequency shift down to 54 Hz, an island event is indicated and appropriate measures can be taken.

FIG. 1 shows one example of a utility network 10. Utility network 10 includes a utility source 12 separated from the network 10 by a utility breaker 14. Network 10 also includes consumer loads 16 and a distributed resource 18 connected to the network 10 through interconnection 20.

Figure 2:
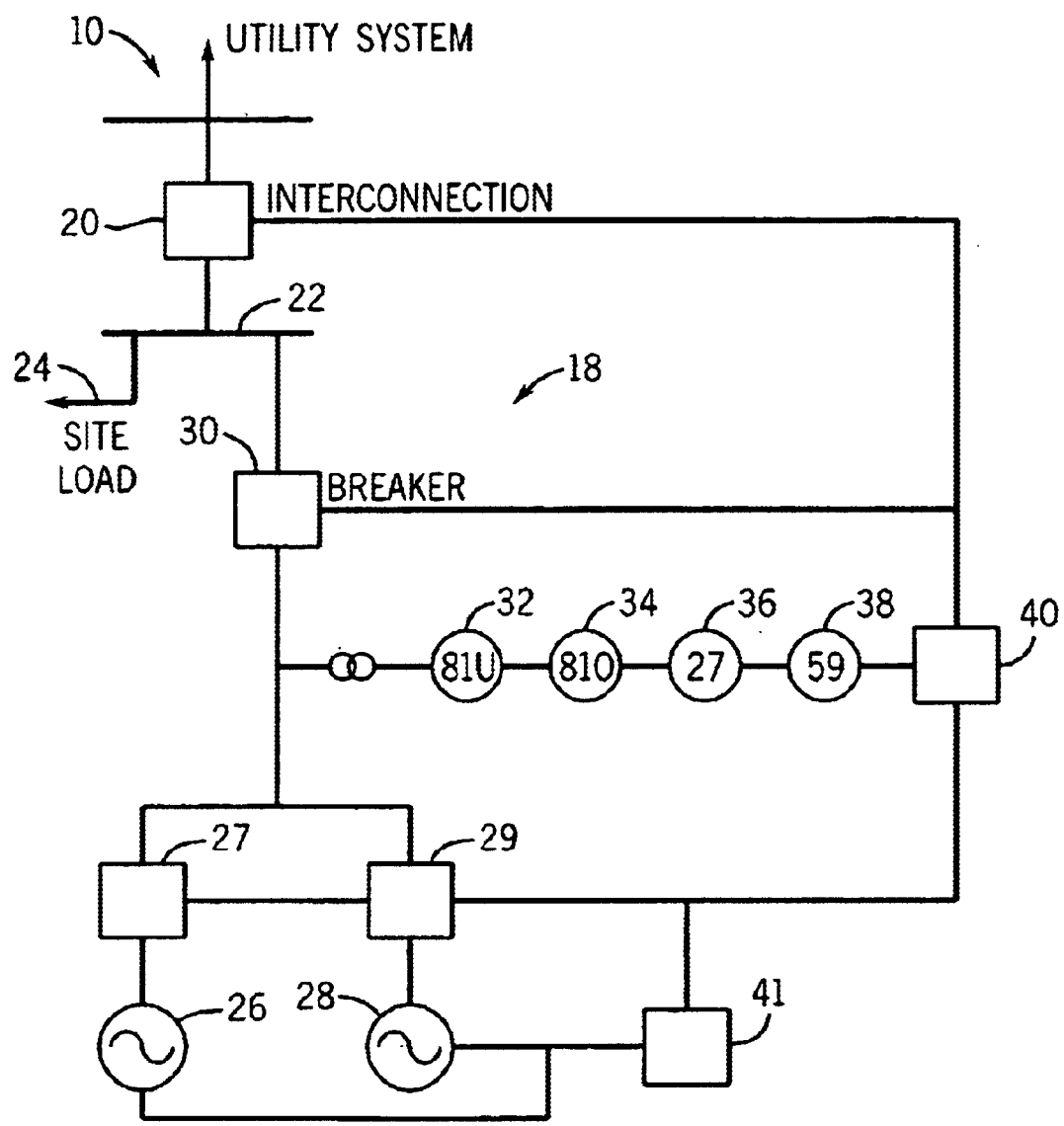
FIG. 2 depicts one embodiment of an island detection system according to the present invention.

FIG. 2 shows an expanded view of distributed resource 18. Distributed resource 18 is connected to network 10 through interconnection 20. Distributed resource 18 includes a local network 22 connecting site loads 24 and power devices 26 and 28 (the power device can be a single unit or multiple units). Power devices 26 and 28 (such as synchronous generators for example) supply power to the local network 22 and possibly to utility network 10. Each power device has an individual breaker 27 and 29. The power devices 26 and 28 are connected to the local network 22 through breaker 30. In addition, the power devices 26 and 28 are also connected to an under frequency protective relay 32, an over frequency protective relay 34, an under voltage protective relay 36, and an over voltage protective relay 38.

Power devices 26 and 28 are connected to an island detection module 40 and controller 41. Island detection module is connected to the relays and the breakers 20, 27, 29, and 30 as well as the controller 41. Controller 41 is connected to the power devices 26 and 28 for controlling operation of these devices. Although these are shown as separate, they can be one unit or individual units for each separate power device (the relays can also be part of this unit or units or individual relays for each power device). If a relay 32, 34, 36, or 38 detects an island condition, island detection module 40 can initiate a anti-island procedure by opening the appropriate breaker during passive detection. During active detection, island detection module 40, through controller 41, induces a change in the operating parameters of one or both power devices 26 and 28 and can initiate an anti-island procedure if an island condition is detected. The island detection module 40 (and controller 41) functionality can be implemented in a number of ways including analog electronic circuits, digital electronic circuits, and in software within a digital control. For ease of discussion, the following description will use an example wherein the power devices are two synchronized generators, the island detection module is implemented with software and is part of the controller, which is an Encorp ENPOWER™ control device.

Island detection module 40 can be set for various modes of detection including active and passive detection. The island detection function can be built into the island detection module 40 using, for example, the firmware of the Encorp ENPOWER™ control devices. The island detection function block can be used in the system software application to detect and act upon a utility island condition. Preferably, the island detection function block is connected in the application software to the local 30, generator 27 or 29 or utility 20 breaker trip discrete output of the ENPOWER™ controller, depending upon system operation requirements.

The under/over frequency protective relays 32 and 34 measure generator frequency and compare this frequency to a frequency trip point. In most cases, there is also a time delay setting in the under/over frequency relay to provide for load transient conditions which would cause an under/over frequency condition below/above the trip point, but not exist long enough to become problematic to the system. Similarly, the over/under voltage protective relays 36 and 38 monitor generator voltage, and compare it to a under/over voltage trip point. Time delays are also used in the under/over voltage protective relay to compensate for transient voltage conditions which may exist on the system, but are not detrimental to the system operation.

Under normal operation, the two synchronous generators 26 and 28 are loaded against the utility using either individual base load controls, or a system import/export load control level. Base load controls will take the individual generator to a fixed KW load point and maintain that power level regardless of load changes across the utility feed. A system import/export load controller will treat the two generators as one power source. In this system, a master controller monitors power flow across the utility breaker, and adjusts the load on the generator(s) accordingly to maintain a constant utility import or export power level. In many cases, the ideal import/export operating point is zero power flow from the utility (zero power transfer). While operating in this mode, the load on the generators is exactly matched to the site load 24. If a loss of utility supply occurs while operating the generators in a base load condition, the generators will trip off because of under/over voltage or under/over frequency as a result of the generator base load setpoint and/or VAR/PF control setpoints not being the same as the site load. Since the base load setpoint is a fixed value, and site loads are rarely static, most often a loss of utility is quickly and reliably detected by the voltage and frequency protective relays in this operating mode.

If a loss of utility occurs while operating in a zero power transfer import/export mode, the potential for non detection of the event is much greater. In this case, the generator loads are matched to the site loads, and a loss of utility will induce no change in the frequency of the generators. Also, if the system is operating at zero reactive power transfer (unity setpoint within the utility PF controller), then there will be no discernable shift in the voltage on the system at the time of a loss of utility. These conditions represent the worst case conditions for detecting an islanded system with DR operating on the site loads. In this case, the over and under frequency, over and under voltage protective relays would fail to detect the island condition.

Two types of island conditions can occur. One condition is the utility island where the utility source 12 is separated from the network 10 and the distributed resource 18 provides power to a consumer load 16. The other island condition is a local island condition where the distributed resource 18 is separated from the utility network 10 and the power devices 26 and 28 continue to provide power to the site load 24. During an island condition, if the power devices 26 and 28 supply more or less than the loads consumed on the utility network, the protective relays 32, 34, 36, and 38 will generally be able to accurately and rapidly detect this island condition.

Depending on the type of island condition, local or network, the system can initiate an anti islanding procedure by separating the power devices from the loads using interconnect 20 for a utility island or breaker 30 for a local island condition (or breakers 27 and 29). The selection of the type of anti islanding procedure that will be followed is dependent upon the requirements for the system operation in the event of a utility outage and resulting island condition. In some systems, it is necessary to isolate the DR from the site load by either opening the local generator breakers 27 and 29, or the tie breaker 30. These systems cannot tolerate the DR staying on load due to capacity issues, power quality issues, or interconnect agreement clauses within the utility interconnect agreement. In other systems, it is desirable to maintain the DR on the site load. In these systems, an island condition would result in the opening (trip) of the utility interconnection breaker 20, while the DR is left supplying the site loads through their local generator breakers 27 and 29 and the tie breaker 30. In both cases, a simple set of dry contacts from the protective relays are used to send a breaker trip command to the breaker(s) that will be opened in the event of an island condition.

In the active detection mode, for example, the island detection module 40 and controller 41 will bias (induce a change in) an operating parameter of one or both power devices 26 and 28. These operating parameters include the voltage, frequency, current or phase of the device outputs. Biasing or inducing a change in an operating parameter of a distributed resource can be accomplished in a number of ways include ramp signals inserted in the control loops of the distributed resource for the various operating parameters. If the utility source 12 is still connected to the network, the biasing will not produce a measurable effect for the reasons stated above. If the utility source 12 is not connected to the network, the biasing will have a significant impact on the system voltage, frequency, current or phase that is detectable and the relays or island detection module will initiate an anti-island procedure. Thus, even if the pre-island load on the power devices 26 and 28 is the same as the post-island load, the system will be able to detect the island condition and act appropriately. The monitoring or measurement of operating parameters can be accomplished in a number of ways including over/under frequency and/or over/under voltage protective relays set to trip when parameters fall outside of normal operating levels.

Figure 3:
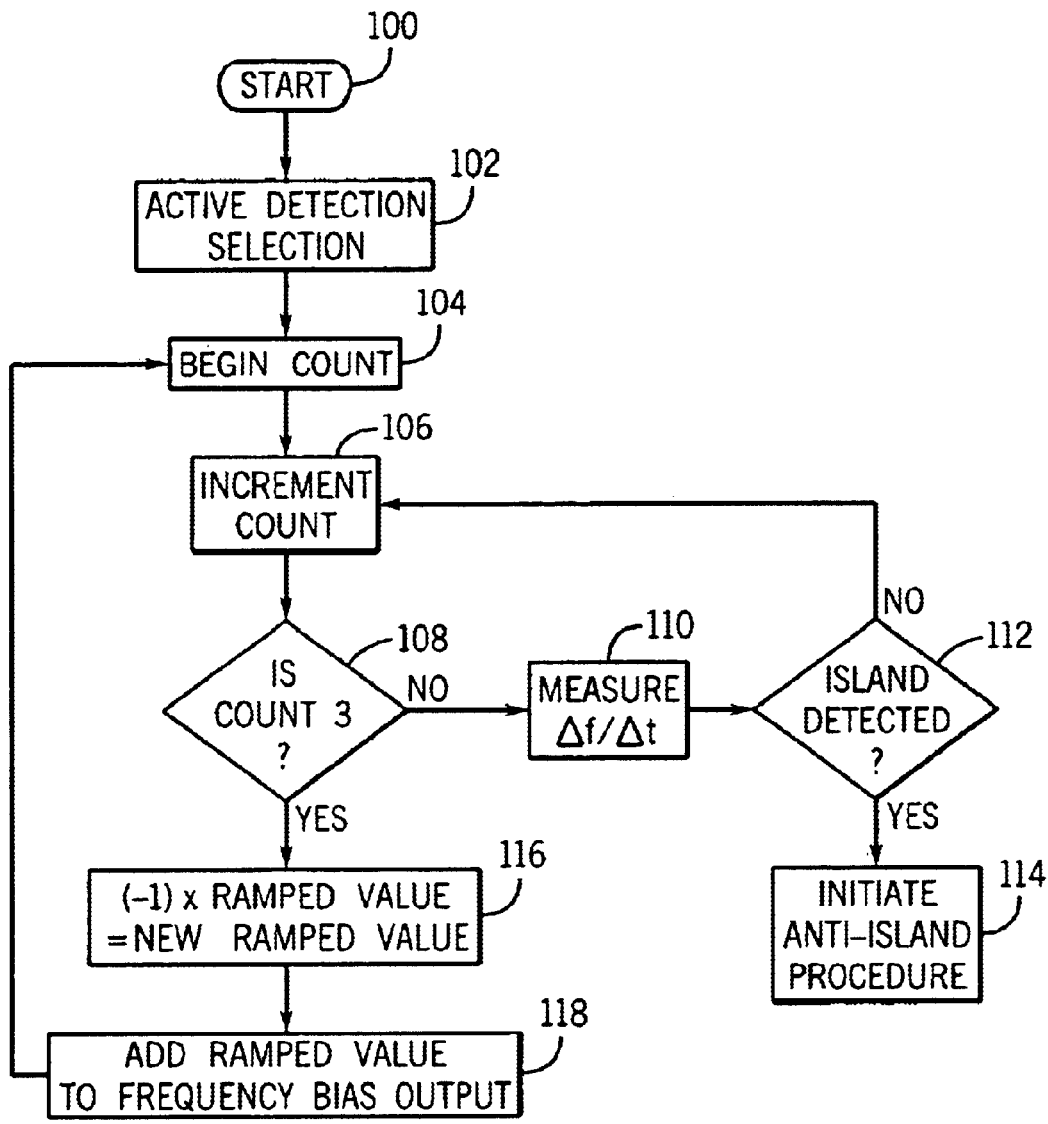
FIG. 3 depicts one embodiment of an active detection process according to the present invention.

FIG. 3 shows one example of an active detection procedure using island detection module 40. The active detection process according to this example is initiated in step 100. Step 102, active detection is selected as an input to the island detection module 40. When the active detection input is selected, active detection will inject a ramped value to the frequency bias output of the ENPOWER™ controller. The recommended range of influence between the ENPOWER™ controller and the engine governor is a +/−5% change in the rated frequency of the generator for a +/−100% output from the frequency bias signal. This will result in a maximum bias signal output from the ENPOWER™ controller results in a 57.0 (−100% frequency bias) to 63.0 (+100% frequency bias) Hz frequency on the generator while operating isochronously. It is this ability to influence the frequency on the generator as a normal part of synchronizing and load control of the generator that allows for active islanding detection by the ENPOWER™ controller. The active biasing of the frequency bias signal out of the ENPOWER™ controller will occur as long as active detection mode is selected, the distributed resource 18 is operating in a utility parallel load control mode, the blocking input is false, and the CB auxiliary input is true. The blocking input is a common input to protective relays that allows an external means of preventing a trip output from the relay. The blocking input is commonly tied to external logic blocks the only arrive at a false (non blocking) condition when all the conditions that require islanding detection to occur are true. Changes in generator frequency will indicate an island condition once they exceed the under/over frequency protective relay settings within the ENPOWER™ controller. Therefore, it is important that the amount of frequency bias generated by the active island detection relay be coordinated with the under/over frequency relay settings.

If an integrating load mode is in control, the output KW variation should be negligible while in parallel with the utility 12 (ramp time must be longer than control loop with integration rate). If the ramp time is less than the controller integration rate, an error in generator KW with respect to the controller setpoint will occur. In some cases this may cause an undesirable fluctuation in the generator KW.

If proportional load control mode is used, then the additional bias will result in a proportional change in KW load while parallel with the utility 12. This is due to the failure of the proportional load control to compensate for the offset in load generated by the active island detection frequency bias signal. Active detection is preferably used in systems where there is the possibility of supporting site loads 24, or the combination of site loads and utility customer loads 16 with the distributed resource 18.

If load on the power devices 26 and 28 is greater than 5% of rated kW, the frequency bias is preferably adjusted downward at a rate that will induce a negative frequency bias ramp to the setpoint specified bias offset level over 3 seconds. See FIG. 3.

As shown in FIG. 3, the active detection process starts by initiating a ramp period in step 104. The ramp period is set in seconds, and adjustable from 0.0 (instant) to 36000 seconds. Step 106, the ramp is incremented. In step 108, a determination is made to see if the ramp is complete. If the ramp is not complete, the process moves to step 110 where the change in frequency over time is measured. The change in frequency is compared to the df/dt short and df/dt long setpoints within the anti-islanding protective relay of the island detection module 40. In step 112, a determination is made as to whether the measured change in frequency over time indicates an island condition by measuring the detected change in network frequency to the df/dt short and df/dt long setpoints. If the setpoints are exceeded by the measured change in frequency, then the island condition is true. The threshold change in frequency over time can be set for various amounts depending on the desired sensitivity of the detection. Time settings from 0.0 (instantaneous) to 36000 seconds will be allowed within the relay. If an island condition is detected (by a measuring/monitoring component or relay), the process proceeds to step 114 where an anti islanding procedure is initiated such as opening breakers 27, 29, or 30 or interconnection 20. This is done by connecting the Target output of the island detection relay to the discrete output driver of the controller. External to the controller, this discrete output drives an interposing relay. This interposing relay is then applied within the trip logic of the breaker in question to cause the breaker to open. If an island condition is not detected, the island detection bias output is maintained at the previous level.

In step 108, if the ramp is complete, the process proceeds to step 116 where a new ramped value will be determined by changing the sign of the current ramped value. This allows a ramped value to be added to the frequency bias output. The bias offset level setpoint can be selected using various criteria depending upon the desired sensitivity of the detection process. The base criteria for the bias offset level setpoint are the rate of acceleration of the machine, and the settings of the df/dt relays. The amount of bias offset generated by the active island detection will directly relate to the df/dt relay setpoints used to ultimately determine an island condition has occurred. Once a new ramped value is determined, the process moves to step 118 where the ramped value is added to the frequency bias output. The ramped frequency bias output signal can be implemented in hardware by driving the PWM signal from the main processor on the ENPOWER™ controller to a level which is directly proportional to the bias offset setpoint specified within the protective relay function. Subsequently, the process returns to step 104 until the specified ramp period to the desired bias offset level is complete.

Figure 4:
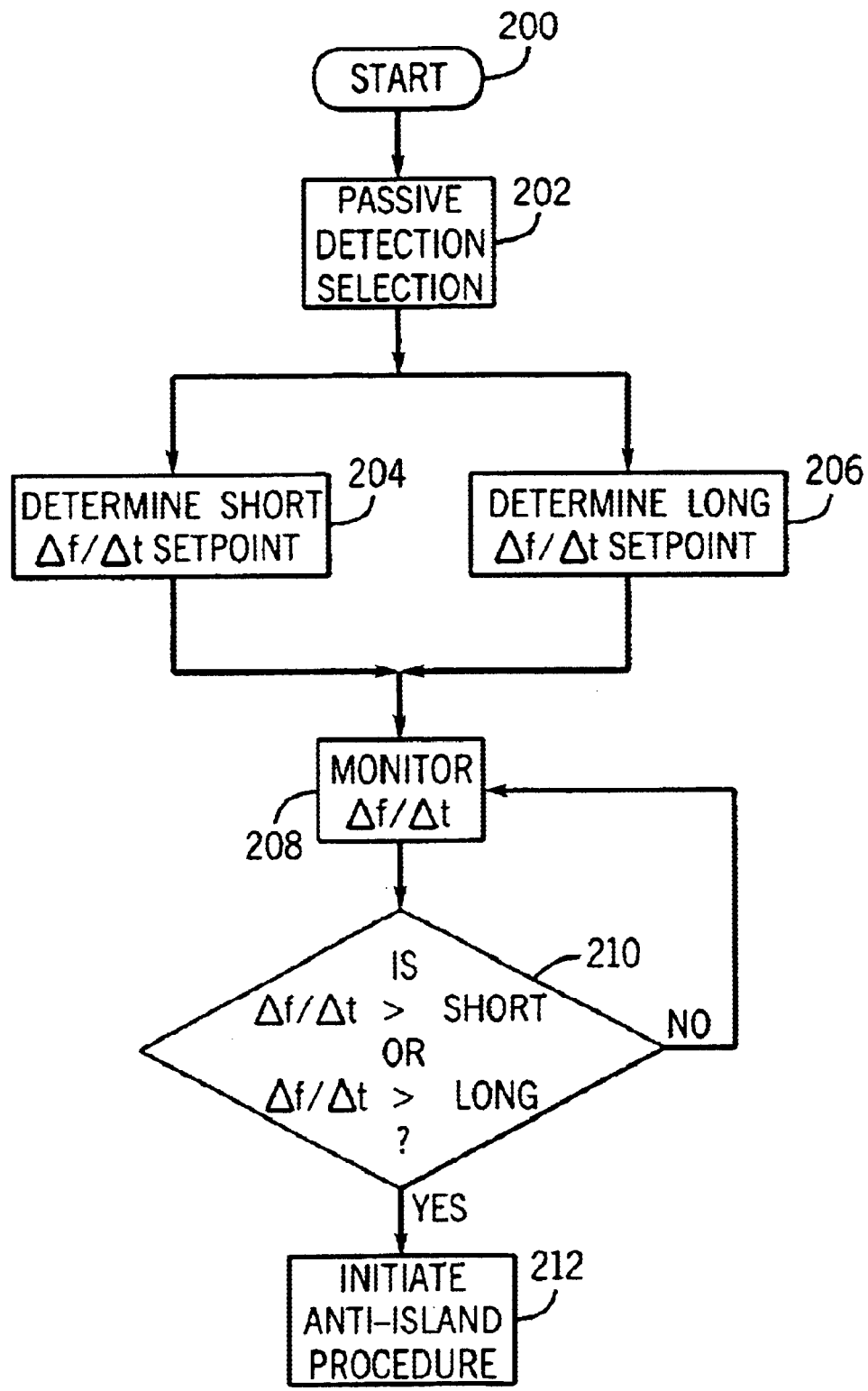
FIG. 4 depicts one embodiment of a passive detection process according to the present invention.

FIG. 4 shows one example of a passive detection process. Passive detection will monitor the rate of change of the frequency of the three phase voltage. A positive or negative step change in the frequency will be used to detect island conditions. The df/dt settings for the long and short relays must be coordinated with the system dynamic response to load changes in order to determine the suitable settings for proper island detection. The passive method of island detection relies upon a specific rate of change in the frequency to cause the island condition to be detected. In some cases, the rate of change in frequency is not sufficient to cause the under/over frequency protective relays to indicate an island. In these cases, the island event will go undetected unless the rate of change increases or another method of island detection is used (such as active detection).

Figure 11:
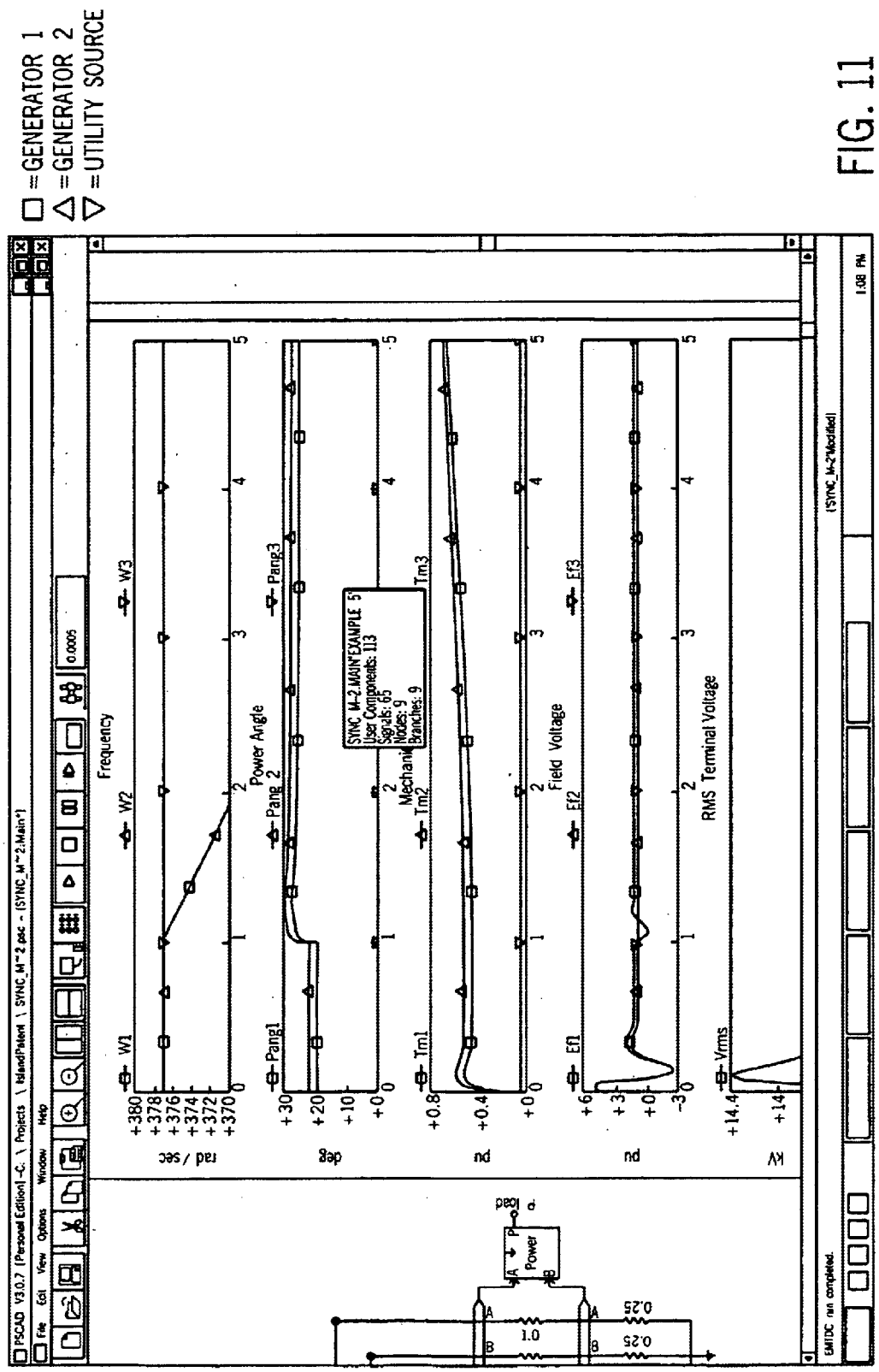
FIG. 11 depicts the system response when the system is islanded with a load much greater than the generator load imposed on the generator at the time of islanding.
Figure 12:
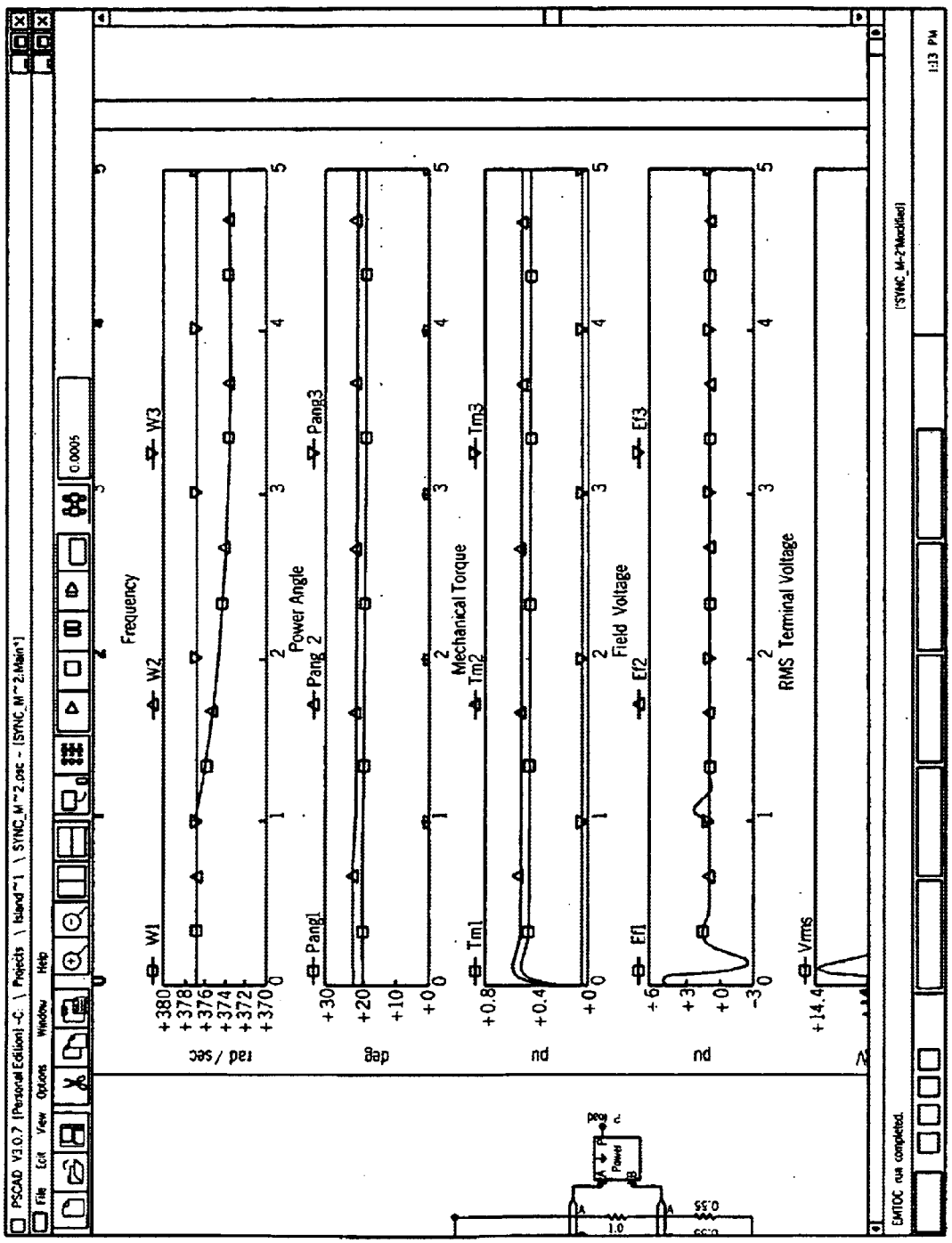
FIG. 12 depicts the system response when the system is islanded with a load slightly greater than the generator load imposed on the generator at the time of islanding.

FIG. 11 and FIG. 12 show two instances of islanding. In one instance (FIG. 11) the island event stands a good chance of being detected by the under frequency detection relay. This is due to the large load being applied to the generator at the time of islanding. FIG. 12 shows an island event with a small differential between the load on the generator prior to islanding and after. In this case, under frequency relays would tend to take a long period of time before sensing the under frequency condition. Active island detection forces a known change in frequency upon the generator in the event of an island condition, which eliminates non detection zones within the protection scheme. A short df/dt setpoint and a long df/dt setpoint can be used to provide different levels of protection for different types of islanding situations. Preferably, there must be a measurable shift in frequency due to a step load change on the power devices 26 and 28 when islanding occurs. However, the shift in frequency is not present when distributed resource 18 is providing the same real and reactive load as is being consumed on the utility (or power devices 26 and 28 are providing the same real and reactive load as is being consumed by the site load 24).

The passive detection process in FIG. 4 begins in step 200. Step 202, the passive detection mode is selected as an input to island detection module 40. The selection of the passive detection process removes any frequency bias offset which may have been generated by the selection of the active island detection, and forces the bias offset value to zero, effectively eliminating active frequency biasing from occurring during passive detection mode. Next, the process determines a short df/dt setpoint in step 204 and a long df/dt setpoint in step 206. Most commonly, generic setpoints are defined for the long/short df/dt settings. These settings are usually around +10% for short duration, and +5% for long. Field testing of these setpoints with the generator operating against site loads can be used to verify, and trim, if needed, the long and short df/dt settings. In some cases an interconnect study may be used to simulate the system using transient simulation software from which the df/dt setpoints are derived. Next, the process will monitor the change in frequency over time in step 208 by monitoring the frequency measured on the three phase voltage inputs to the controller, and comparing this frequency to the previously measured frequency on the three phase voltage inputs to the controller. In step 210, a determination is made as to whether the monitored change in frequency over time exceeds either the short or long df/dt setpoint. If the determination is no (no island event detected), the process returns to step 208 to sample the change in frequency over time again. The frequency is sampled at a rate determined by the zero crossing frequency of the first order harmonic waveform. If either the short or long setpoint is exceeded (island condition detected), the process proceeds to the step 212. In step 212, the process initiates an anti islanding procedure such as opening breaker 27, 29, or 30 or interconnection 20. This is done by connecting the Target output of the island detection relay to the discrete output driver of the controller. External to the controller, this discrete output drives an interposing relay. This interposing relay is then applied within the trip logic of the breaker in question to cause the breaker to open.

The island detection module 40 will indicate true (island condition detected) when the short or long df/dt setpoint is exceeded. The target output indication of the island detection module will indicate true when internal software of the island detection module detects an over or under frequency condition in existence for as long as or longer than the short or long df/dt setpoint. The examples herein describe a microprocessor based detection system and method. However, the detection process and system can use analog or digital and hardware or software based methods to accomplish the detection.

In this example, the long rate of change of the frequency will be determined by averaging the frequency over 60 sampling periods and comparing this average to the average of the previous 60 sampling periods. This allows the system to prevent distributed resource tripping on island detection due to upstream faults in the system that do not induce islanding. An example of this could be a large motor load occurring on a high impedance, or "soft" utility connection, which results in a momentary frequency sag which is quickly recovered by the utility source. The long setpoint can be set for any condition, but is preferably set for 50% of the maximum frequency shift expected by the active detection frequency bias in one second for this example. This setting is preferred to detect an island condition as quickly as possible with high reliability. A setting of 50% of the maximum frequency shift for one second assures that transient events have not caused the frequency deviation to occur, and that it is of sufficient amplitude to warrant the island detection algorithm to indicate an island has occurred.

The short rate of change of the frequency will be determined by averaging the frequency over three sampling periods and comparing this average to the average of the previous three sampling periods for this example. The short setpoint is preferably much larger than the long setpoint, but less than the 81 o/u setting. The ranges of these setpoints can be varied greatly. Most commonly, generic setpoints are defined for the long/short df/dt settings. These settings are usually around +10% for short duration, and +5% for long. Field testing of these setpoints with the generator operating against site loads can be used to verify, and trim, if needed, the long and short df/dt settings. In some cases an interconnect study may be used to simulate the system using transient simulation software from which the df/dt setpoints are derived. In addition, larger, more rapid changes and frequency are generally detected by the 81 o/u relay.

FIG. 6 shows the inputs, outputs and setpoint ranges which will define the islanding detection relay function block. The function block can be utilized in their construction of the system controls within the Encorp ENPOWER™ controllers.

Figure 5:
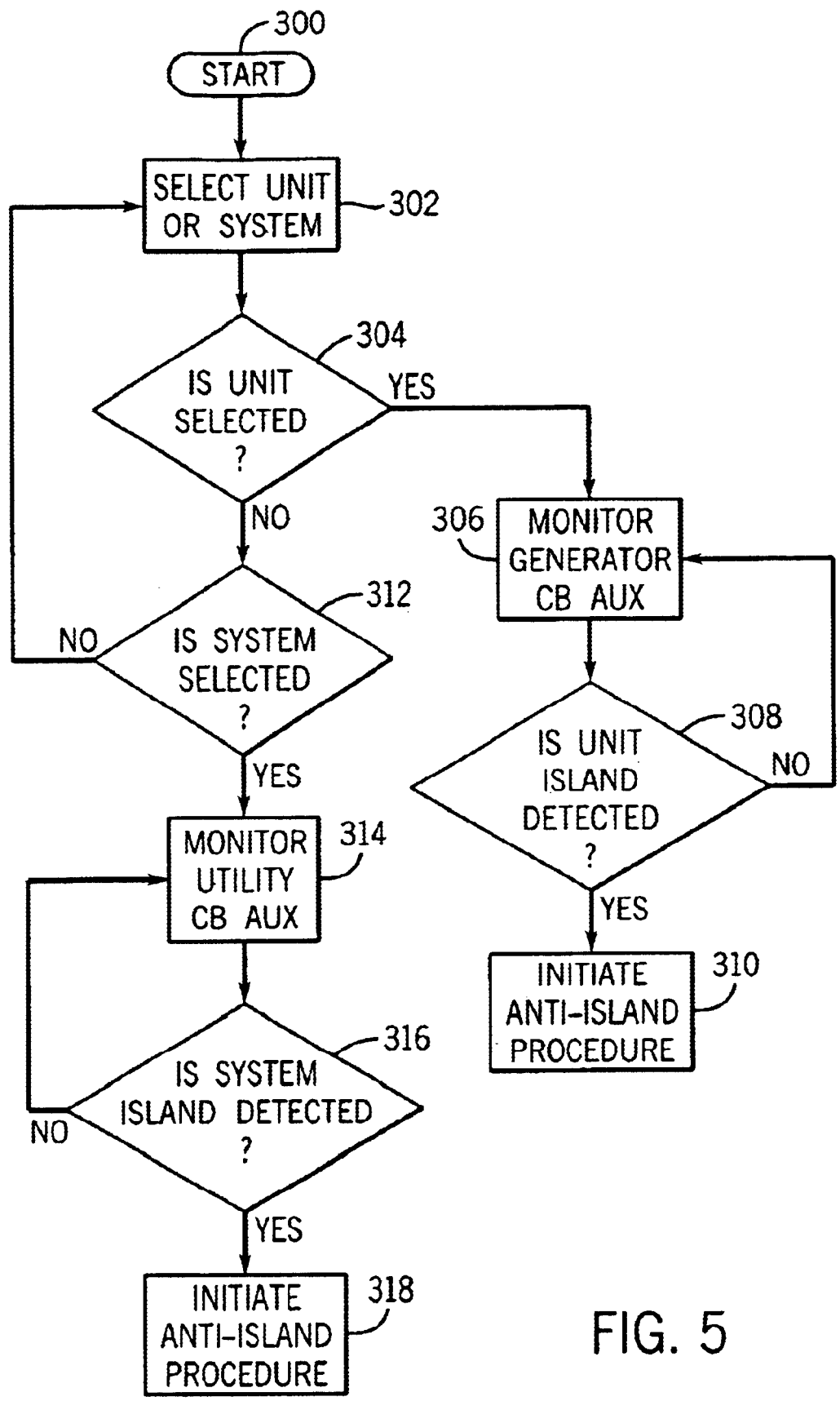
FIG. 5 depicts one embodiment of a system/unit detection process according to the present invention.
Figure 7:
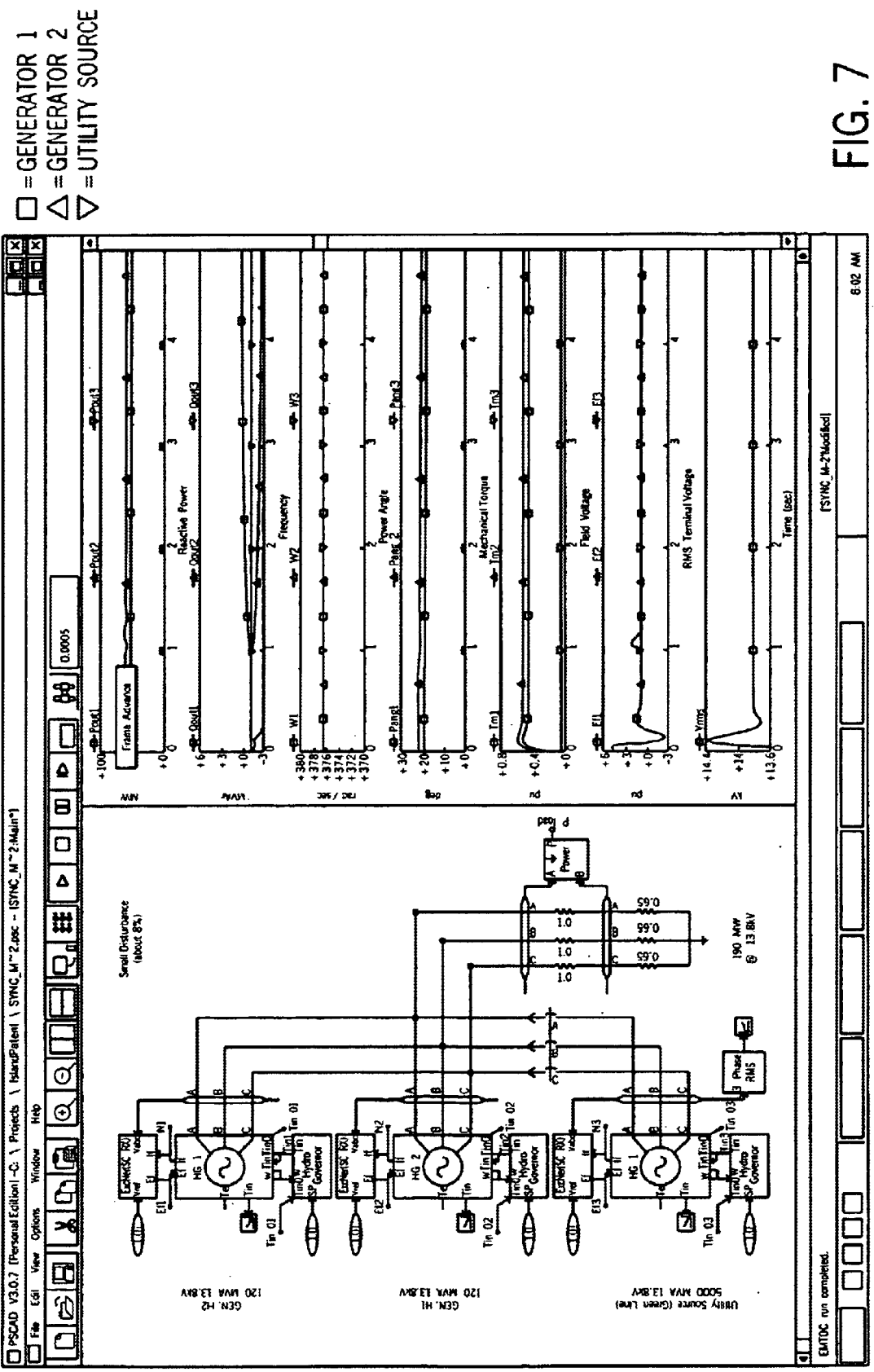
FIG. 7 depicts a two generator system with a utility source
Figure 8:
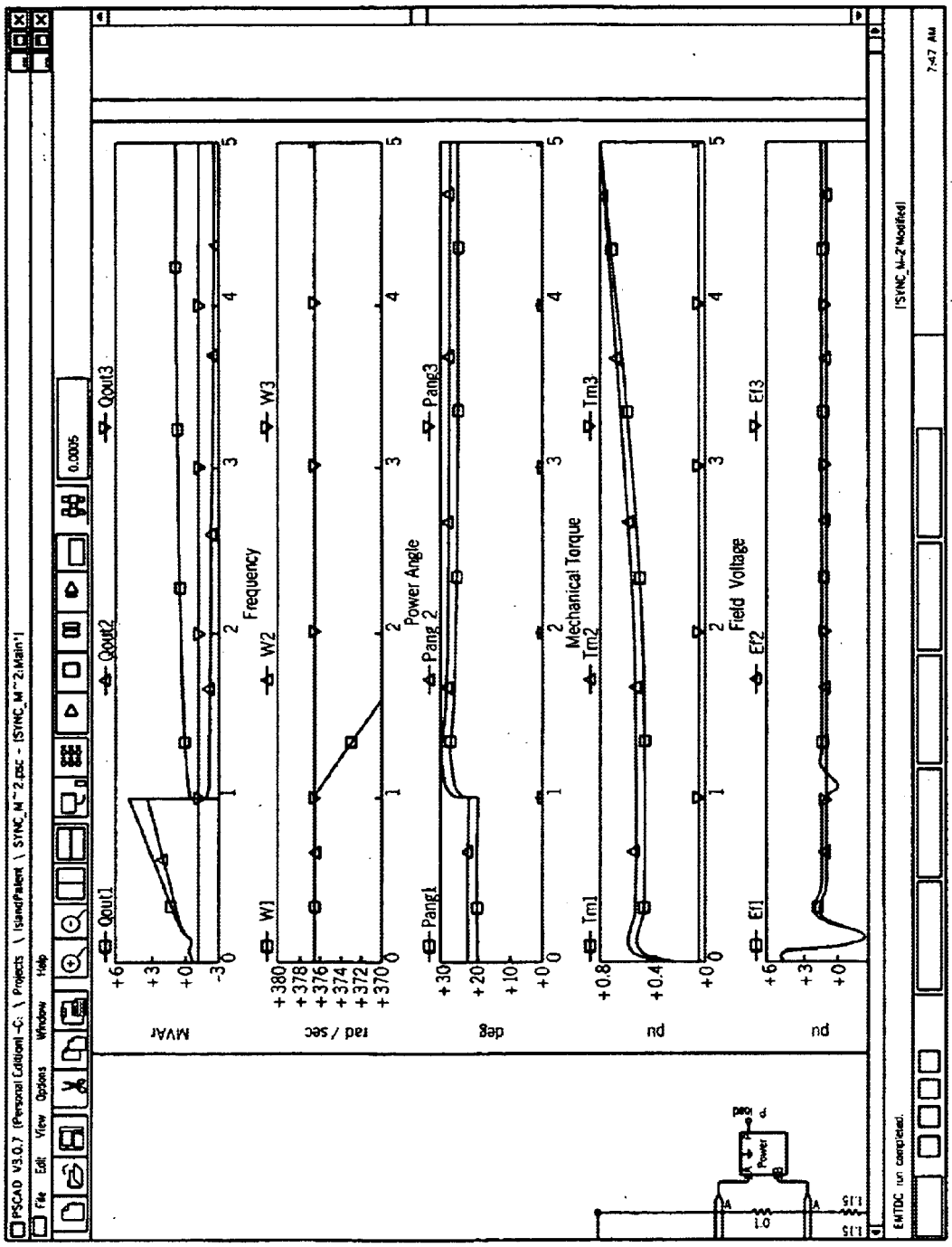
FIG. 8 depicts the system response when the system is islanded with the local loads greater than the generator loads at the time of islanding
Figure 9:
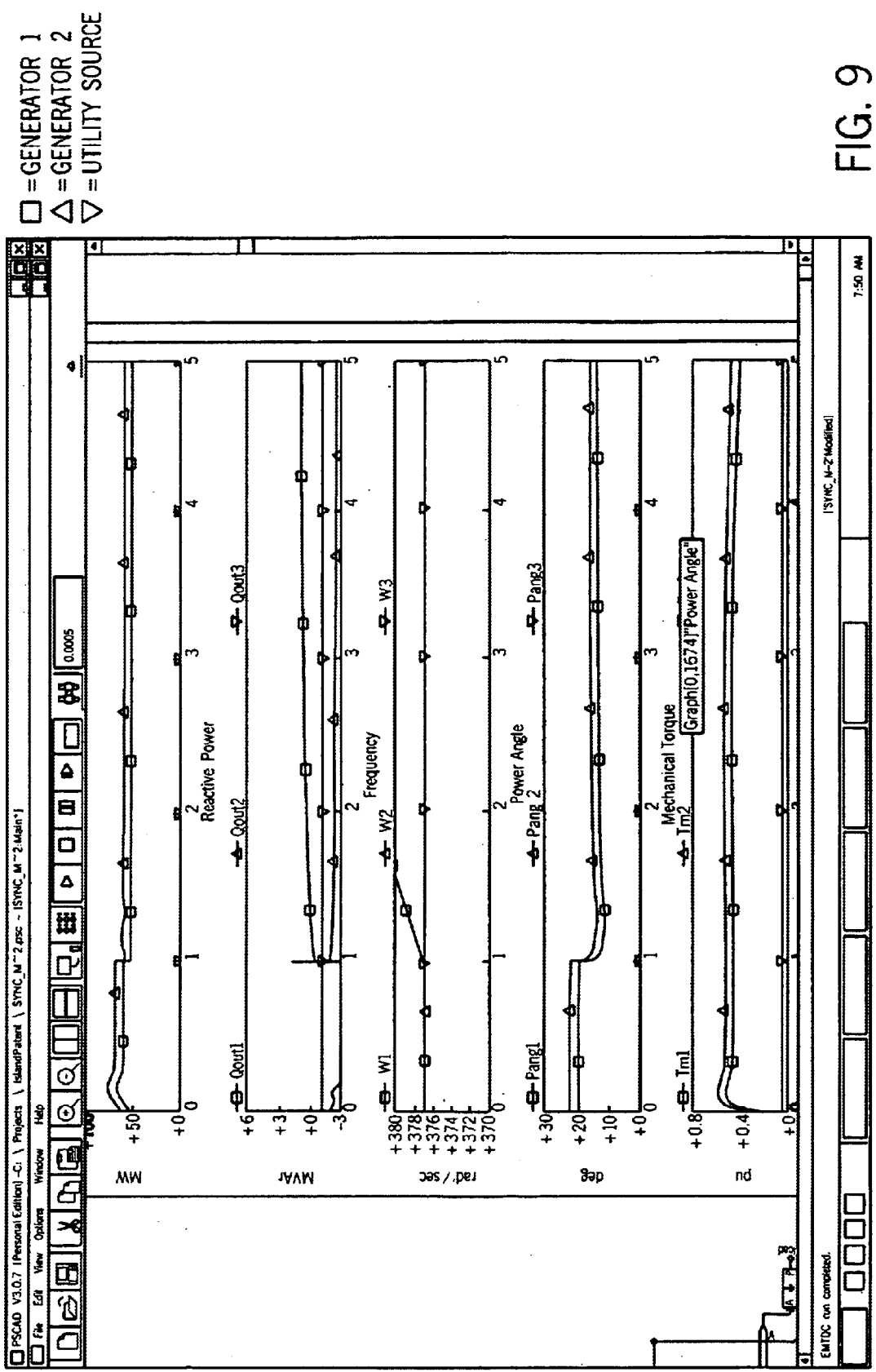
FIG. 9 depicts the system response when the system is islanded with the local loads less than the generator loads at the time of islanding.

FIG. 5 shows one embodiment of a system/unit detection process. To detect islanding on unit or system basis, two variations on the island detection module 40 can be used. The main difference between the unit and system detection process is that in a system mode, there is a defined system "Master". This master is selected by selecting the System Master input on the island detection relay function block. Once selected, the master broadcasts the frequency bias offset signal to the receiving unit controllers (generator controllers), which then add this bias offset to their own frequency bias signals. This results in a synchronized, unidirectional bias signal being maintained upon multiple unit controllers operating in the system under the common master. Typically, the system mode is used when two or more generators are connected to a common site load.

In a unit mode, each individual generator acts as its own master, imposing the frequency bias as determined by its own island detection relay function block to the generator under its control. Unit mode is only used in single unit systems.

The system island detection module 40 will monitor the utility CB auxiliary input to the designated ENPOWER™ controller CB auxiliary input terminal blocks to determine when the utility is on load. Since island conditions can only exist when generators are on load, and the utility breaker closed, it is necessary to monitor the state of the individual system breakers to determine when this condition exists. The individual generator controllers will monitor the state of their individual generator CB auxiliary inputs at the designated ENPOWER™ controller terminal blocks and only receive the bias input command from the system master if their generator circuit breakers are closed. It is important to only apply one master island detection device per utility feed. Application of more than one master island detection device per island feed would result in erroneous frequency bias offset commands being sent to the unit generator controllers. The system island detection mode is selected by setting the "System Master" input to the island detection function block TRUE.

The unit island detection module will monitor the utility CB auxiliary at the designated ENPOWER™ controller terminal blocks inputs, and operate when in either a base load control, or import/export control mode the blocking input is false, and the CB auxiliary is true. The unit mode can be selected by setting the system master input to the island protection function block FALSE. Unit island detection mode should only be applied in systems with one controller operating in parallel with the utility.

FIG. 5 shows one example of this process. The process is initiated in step 300. Step 302, the unit or system mode is selected. Step 304, a determination is made as to whether the unit mode is selected. If yes, the process continues to step 306. Step 306, the process monitors the generator CB AUX. In step 308, determination is made as to whether a unit island condition is detected. If no, the process returns to step 306 to monitor the generator CB AUX. If yes, the process proceeds to step 310. In step 310, anti-islanding procedures are initiated such as opening breaker 30. The island could be far up stream of the interconnection 20.

In step 304, if it is determined that the unit mode is not selected, the process continues to step 312. The process determines if the system mode is selected in step 312. If no, the process returns to step 302 to allow the selection of unit or system mode (or the system can allow selection of both). If the system mode is selected, the process proceeds to step 314. In step 314, the process monitors the utility CB AUX. Step 316, a determination is made as to whether a system island is detected. If no, the process returns to step 314 to monitor the utility CB AUX. If a system island is detected in step 316, the process continues to step 318. In step 318, an anti-islanding procedure such as opening interconnection 20 is initiated. Alternatively, breaker 30 can be opened to drop the power devices 26 and 28 from both the local and utility networks. However, if it is a system island, breaker 30 can be kept open to allow power for the site load 24.

An alternative means of system island detection can be realized by implementing the same control algorithm and island detection methods used for unit island detection within a single system master control. In this method, the system master is used to provide real and reactive load references to the unit controllers to maintain either a specific import or export power level across the utility tie. The system control, which is only active when parallel operation of the DR with the utility occurs, uses a KW control PID to maintain an import or export power level with the utility. By injecting a ramped bias signal after the KW control PID, an offset is induced in the unit controllers, which is negated by the integrator feedback in the system master load control PID. As with the unit method of active island detection, as long as there is a utility source present to maintain a constant frequency and voltage, the bias offset is integrated out by the system load control PID. Once the utility fails to provide a solid voltage and frequency reference to the system control (i.e. an island condition), the imposed bias offset realizes itself as a shift in the frequency of the DR system, which can then be detected using over/under frequency and/or over/under voltage protective relays within the DR supplied system.

Several modifications to the methods and systems described herein can be made without depart from the spirit and scope of the invention. For example, the detailed description has mainly referred to two power devices. However, this invention can be applied to a single power device or multiple power devices. Also, power devices 26 and 28 used for the examples herein have been described as synchronized generators. It should be understood that they can also be photovoltaics, wind, hydro, fuel cells, storage systems such as battery, super-conducting flywheel, and capacitor types, and mechanical means including conventional and variable speed diesel engines, Stirling engines, gas turbines, and micro-turbines. In addition, the relays, detection modules and controllers can be implemented with any number of conventional devices such as analog electronic circuits, digital electronic circuits, in software or by mechanical means. Furthermore, the operating parameters measured and biased can be voltage, frequency, current or phase of the voltage or current.

One example of an active detection method for use with single or multiple generator sets as the distributed resources provides a ramped triangle bias to the load control loop of the generator. This bias is transmitted to the speed control reference through the frequency bias output of the generator controller. The bias signal acts upon the speed control reference, which in turn causes an offset in the speed control PID (proportional band integral derivative). In utility parallel applications, this offset manifests itself as a change in load on the generator, since the frequency of the generator is held constant by the utility. The resulting change in load on the generator is then fed back to the generator controller PID. The PID acts upon the change in load, adjusting the PID output to maintain the desired load setpoint. The active control algorithm assumes that the integration rate of the PID is less than the ramp rate of the active island ramp generator. However, when the utility source is no longer acting as a constant frequency reference, the variation in the frequency bias signal to the speed control manifests itself as a change in the machine frequency, while the load on the generator is purely a function of the loads on the islanded system. The change in machine frequency causes the speed controller to attempt to increase or decrease the machine speed, which then causes the over/under frequency relay to detect the event and issue a contact output. This contact output is then used to either isolate the generator from the islanded system, or to open a breaker between the islanded system and the utility which maintains local power on the DR without the risk of energizing lines outside of the local system.

Figure 13:
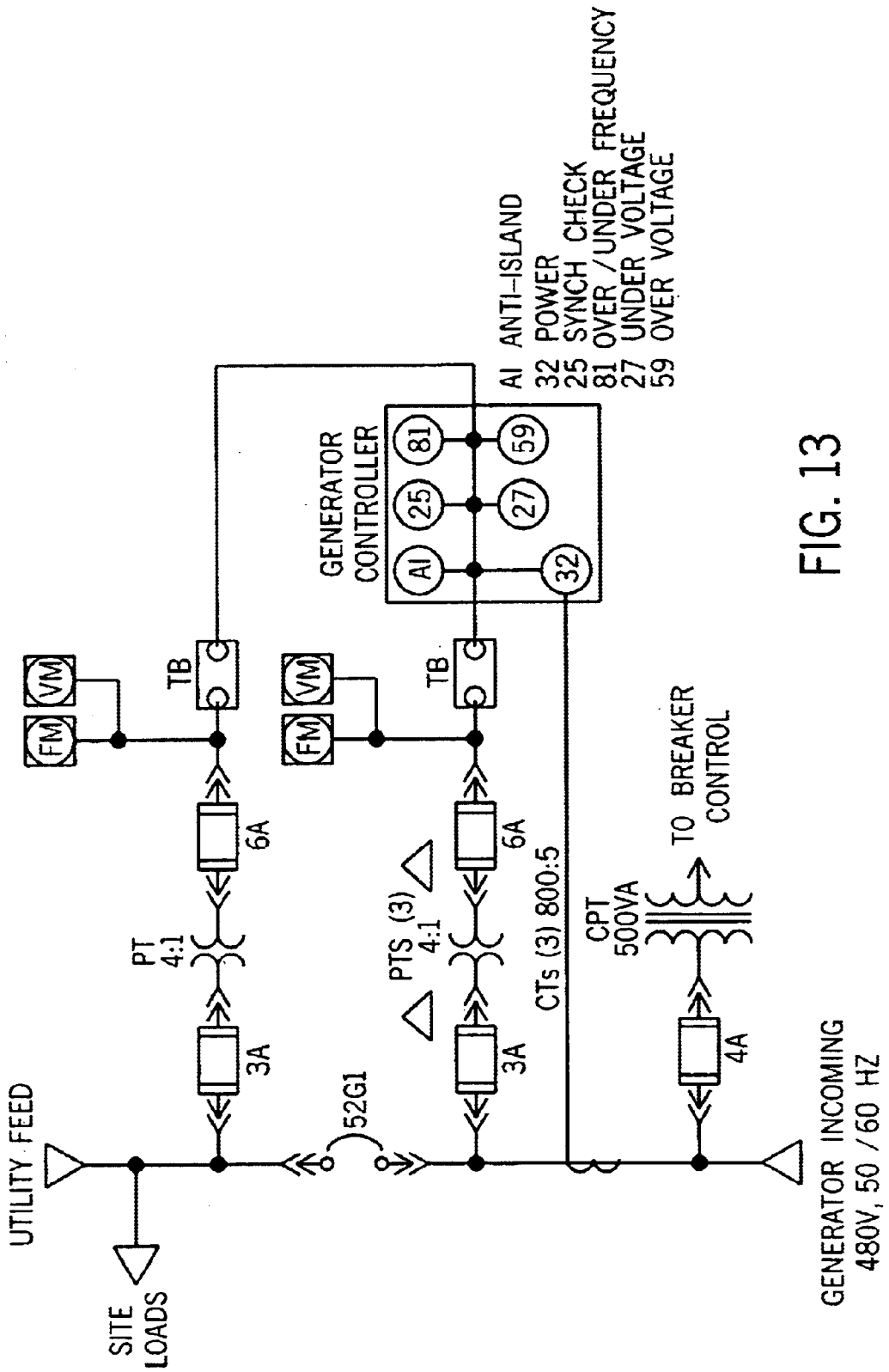
FIG. 13 depicts one embodiment of a single unit island detection system according to the present invention.
Figure 14:
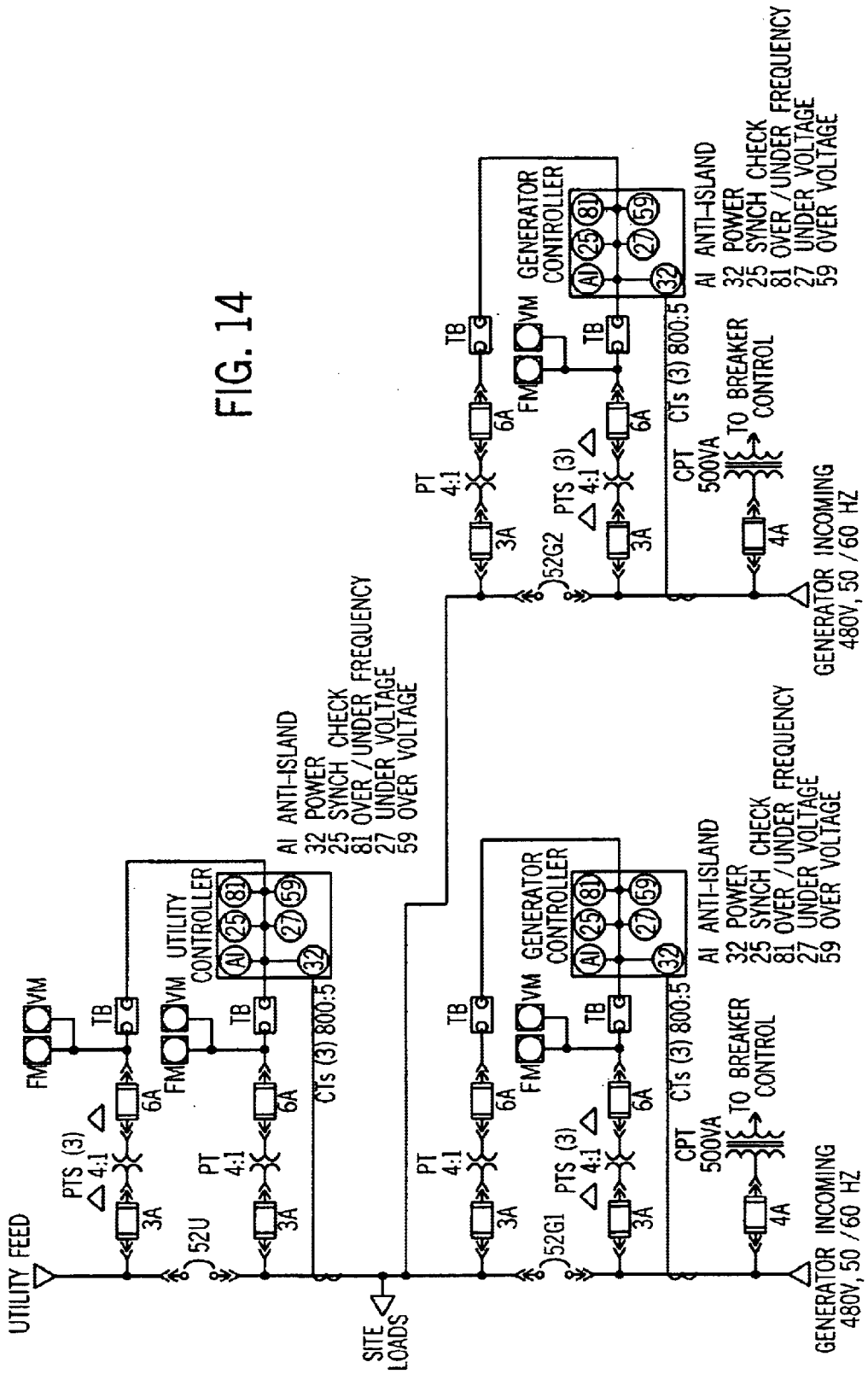
FIG. 14 depicts one embodiment of a multi-unit island detection system with a utility controller according to the present invention.
Figure 15:
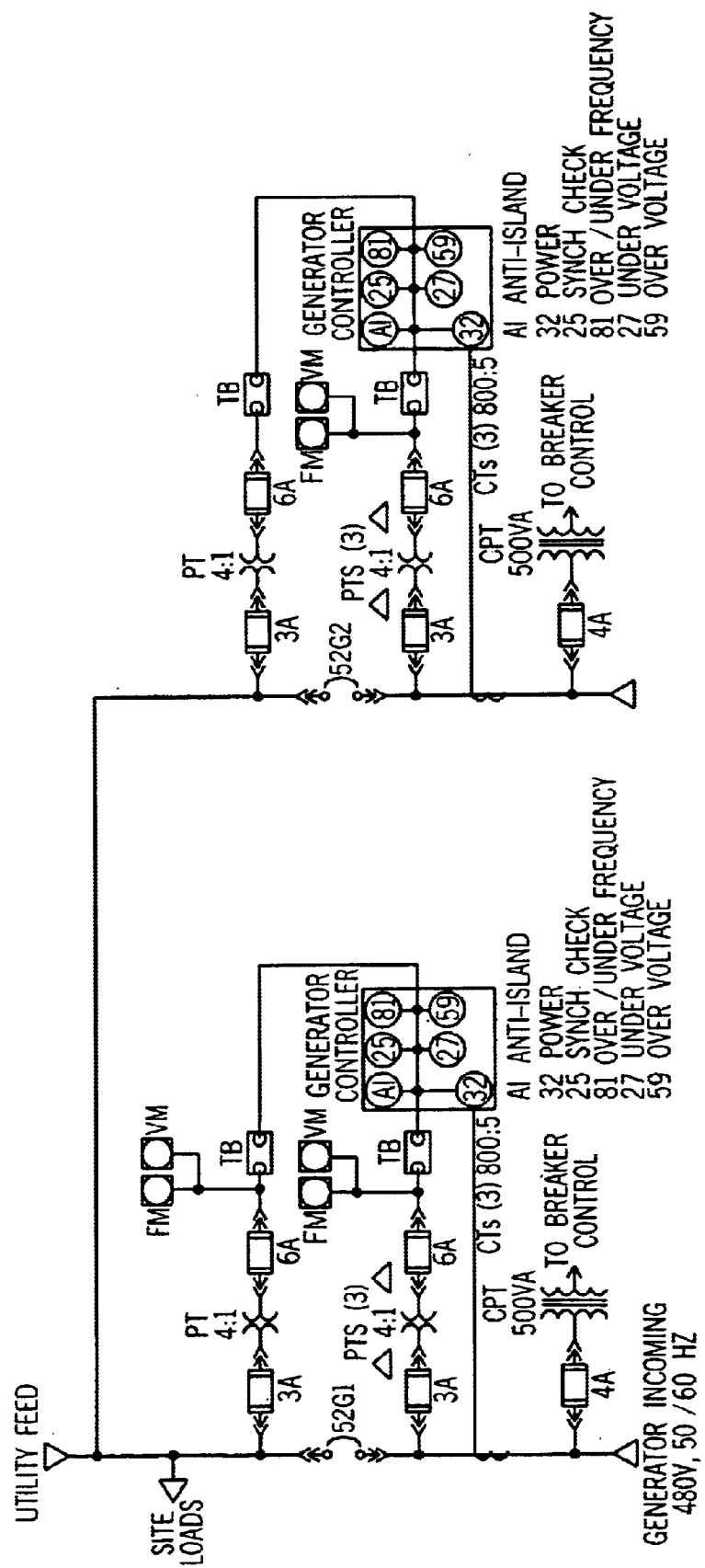
FIG. 15 depicts one embodiment of a multi-unit island detection system according to the present invention.

FIGS. 13–15 show examples of single and multiple unit systems with or without utility controller. FIG. 13 shows a single unit island detection system. In this system, the controller would directly control the generator breaker. The controller includes an anti-island protective relay (AI), power relay (32), synch check relay (25), over/under frequency relay (81), under voltage relay (27), and over voltage relay (59). A trip would occur at the generator breaker upon detection of an island condition. Sensing of voltage and frequency would occur through the three phase PTs on the generator side of the breaker.

FIG. 14 shows a multiple unit island detection system with a utility controller. In this system, the master island detection would occur in the utility controller. This controller would send a common frequency bias command to any unit controllers on load. The utility controller would be programmed to either open the utility breaker upon island detection, or command the generator controllers to open their generator breakers upon island detection, depending upon the operating requirements of the site/system.

FIG. 15 shows a multiple unit island detection system without a utility controller. In this system, the controller would directly control the generator breaker. A trip would occur at the generator breaker upon detection of an island condition. Sensing of voltage and frequency would occur through the three phase PTs on the generator side of the breaker. Controller logic would be used to provide a master bias command for both utility units when both units are operating with their respective breakers closed to the utility. The position of the master is arbitrary to the operation of the overall system. The master bias command is needed to keep the polarity of the bias command the same for all units on load.

Figure 16:
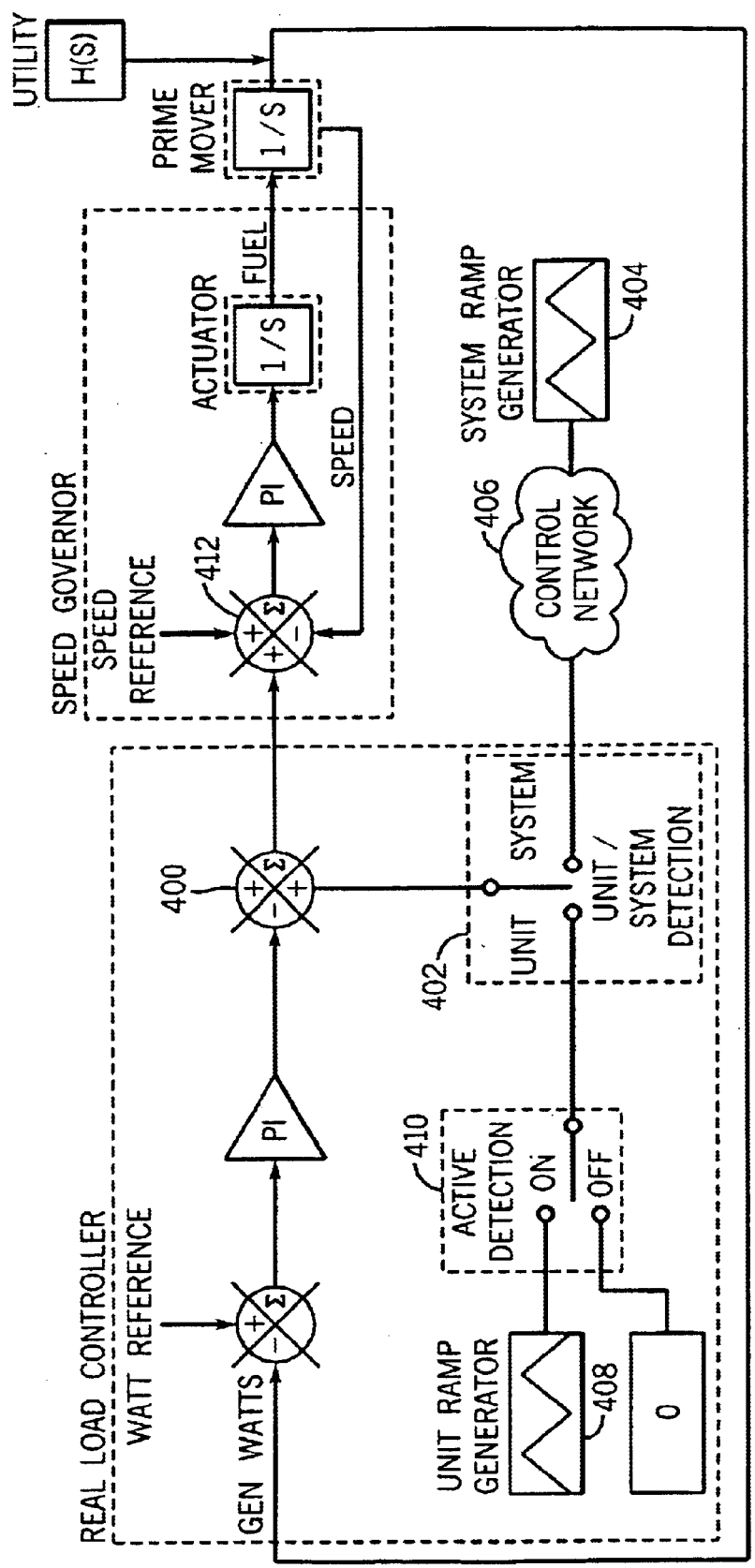
FIG. 16 depicts a one line diagram of an active biasing signal scheme using a frequency bias signal according to one embodiment of the present invention.

FIG. 16 shows an one line diagram of an active bias signal scheme according to one embodiment of the invention. The embodiment shown provides an active bias signal to the frequency integrator 400 to bias the frequency of the local generator (unit). This embodiment has an unit/system selection module 402 for selecting either unit or system biasing. If system biasing is selected, the local generator will receive a biasing signal from a system ramp generator 404. Under system biasing, each local generator connected to the system will receive the same biasing signal from the system ramp generator 404 through a common control network 406. A unit that has been designated as the master island detection unit would provide the system ramp signal to the receiving unit. For example, in a system with 3 local generators, one of the local generators can be designated as the master island detection unit and provide the system ramp signal to the other two receiving units using the chosen unit's unit ramp generator. This is preferably used in systems that have more than one local generator supplying the same load.

If the unit/system selection module 402 is set for unit biasing, the local generator will receive a biasing signal from a local unit ramp generator 408 provided active detection is also selected. Active detection is selected through active detection module 410. When the unit/system selection module is set for unit and the active detection module 410 is on, unit ramp generator 408 provides a ramp signal to the frequency integrator 400. The frequency integrator 400 provides a frequency bias output to a speed integrator 412. The speed integrator 412 provides an output for use in controlling the speed of the local generator, which in turn controls the frequency output of the local generator. System and unit ramp signals are the same type of signal but from different sources. For unit biasing, the ramp signal comes from the local unit ramp generator and is used by that local generator alone. For system biasing, one local unit ramp generator provides the ramp signal for all generators controlled by the system.

The term normal system (or network) parameters is used to describe the normal operating parameters of a particular network. For example, a typical network might operate with system parameters of 120V and 60 Hz. The parameters can be different and are usually dictated by the utility. A distributed resource can be made to operate at any variation of operating parameters. When the distributed resource is connected to the network, the distributed resource synchronizes with the normal system parameters so that the distributed resource supplies power at the normal system parameters. FIGS. 7–12 show one example of system parameters for a network.

The monitoring of system parameters can be accomplished in a number of ways. One approach is to use the relays shown in the generator controllers of FIGS. 13–15. Voltage, current, and frequency meters can also be used as well as software such as that in the Encorp ENPOWER™ control device. For passive and active detection, the amount of change in system parameters necessary to indicate an island condition can be set at various levels. For example, a change in system parameters greater than 1% can be used to indicate an island condition. In addition, the level set can be different for different parameters such as a 1% change in frequency and a 5% change in voltage. However, if the level is set too low, the system may falsely indicate an island condition because of a change in system parameters caused by non-island events such as the addition or deletion of loads or resources to the network. IEEE provides some guidance for what levels of change should be detected by island detection systems.

What is claimed is:

1. A method of island detection for a distributed resource connected to a network having a load and a utility source, comprising:

energizing the distributed resource to supply power to the network;

operating the distributed resource at normal system parameters;

inducing a change in at least one operating parameter of the distributed resource; and monitoring at least one of the system parameters, wherein inducing a change includes:

adding a positive ramped value to a frequency bias output of the distributed resource;

adding a negative ramped value to the frequency bias output;

monitoring the frequency bias output; and detecting an island event based on the monitored frequency bias output.

2. The method of island detection according to claim 1, further comprising:

setting a short df/dt setpoint;

setting a long df/dt setpoint;

monitoring a rate of change of a frequency of a voltage; and detecting the island event based on the monitored rate of change of the frequency of the voltage.

3. The method of island detection according to claim 2, wherein the island event is detected when the rate of change of the frequency exceeds the long df/dt setpoint, the rate of change of the frequency is determined by averaging the frequency over 60 sampling periods and comparing the average to an average of a previous 60 sampling periods.

4. The method of island detection according to claim 3, wherein the long df/dt setpoint is set for approximately 50% of a maximum frequency shift expected by an active detection frequency bias in a one second period.

5. The method of island detection according to claim 2, wherein the island event is detected when the rate of change of the frequency exceeds the short df/dt setpoint, the rate of change of the frequency is determined by averaging the frequency over three sampling periods and comparing the average to an average of a previous three sampling periods.

6. A system for detecting an island condition in an utility network, comprising:

a distributed resource connected to the utility network through a feeder line;

an active detection module monitoring the distributed resource; and a biasing device connected to the distributed resource, wherein the biasing device is configured to induce a change in at least one operating parameter of the distributed resource by adding a positive ramped value and a negative ramped value to the at least one operating parameter of the distributed resource, and wherein the active detection module is configured to monitor the at least one operating parameter.

7. The system of claim 6, wherein the active detection module is connected to the feeder line for monitoring system parameters of the utility network and the biasing device is a controller for controlling an operation of the distributed resource.

8. The system of claim 7, wherein the active detection module is connected to the biasing device for sending a biasing signal to the biasing device.

9. The system of claim 8, wherein the biasing signal causes the biasing device to induce the change in the at least one operating parameters of the distributed resource.

10. The system of claim 9, wherein the change in the at least one operating parameters is one of a change in a frequency, a voltage, a current, a phase of the voltage and a phase of the current.

11. The system of claim 9, wherein the active detection module detects the island condition based on a change in the monitored system parameters.

12. The system of claim 11, wherein the change in the monitored system parameters is caused by the induced change in the at least one operating parameters of the distributed resource.

13. The system of claim 12, wherein the active detection module includes an over voltage relay, an under voltage relay, an over frequency relay, and an under frequency relay.

14. A method of system and unit island detection using a detection module for a distributed resource connected to a network having a load and a utility source, comprising:

setting the detection module for one of a unit detection and a system detection;

monitoring a circuit breaker of the distributed resource when the detection module is set for unit detection;

monitoring a circuit breaker of the utility source when the detection module is set for system detection;

detecting an island event based on the monitored circuit breaker, wherein detecting an island event includes adding a positive ramped value and a negative ramped value to an output of the distributed resource and monitoring the output; and initiating an anti-islanding procedure when the island event is detected.

15. The method of claim 14, wherein the output of the distributed resource is one of a frequency, a voltage, a current, a phase of the voltage, and a phase of the current.

* * * * *